US011649951B1

(12) United States Patent
Kennemer et al.

(10) Patent No.: US 11,649,951 B1
(45) Date of Patent: May 16, 2023

(54) MANUFACTURING OF LIGHT EMITTING MODULES

(71) Applicant: Tractor Supply Company, Brentwood, TN (US)

(72) Inventors: Brian Kennemer, Chapel Hill, TN (US); Christian D. Fogg, Columbia, TN (US); Fan Shi Jun, Guangzhou (CN)

(73) Assignee: Tractor Supply Company, Brentwood, TN (US)

( * ) Notice: Subject to any disclaimer, the term of this patent is extended or adjusted under 35 U.S.C. 154(b) by 61 days.

(21) Appl. No.: 17/540,797

(22) Filed: Dec. 2, 2021

(51) Int. Cl.
*F21V 19/04* (2006.01)
*H05B 47/20* (2020.01)
*H05B 47/10* (2020.01)
*F21V 15/01* (2006.01)
*F21V 17/10* (2006.01)
*F21V 15/00* (2015.01)
*G01R 31/44* (2020.01)

(52) U.S. Cl.
CPC .............. *F21V 19/04* (2013.01); *F21V 15/01* (2013.01); *H05B 47/10* (2020.01); *H05B 47/20* (2020.01); *F21V 15/005* (2013.01); *F21V 17/101* (2013.01); *G01R 31/44* (2013.01)

(58) Field of Classification Search
CPC ........ F21V 19/04; F21V 15/01; F21V 15/005; F21V 17/101; H05B 47/10; H05B 47/20; G01R 31/44
See application file for complete search history.

(56) References Cited

U.S. PATENT DOCUMENTS

| 4,033,243 | A | * | 7/1977 | Kirrish | ................. | F16B 37/145 |
| | | | | | | 411/338 |
| 4,453,202 | A | * | 6/1984 | Morris | ................... | F21S 8/024 |
| | | | | | | 362/225 |
| 7,348,604 | B2 | | 3/2008 | Matheson | | |
| 2005/0248948 | A1 | * | 11/2005 | McCarthy | ............... | F21V 15/01 |
| | | | | | | 362/362 |

(Continued)

OTHER PUBLICATIONS

TorkBolts website print out from: https://losspreventionfasteners.ca/store/products/tork-bolts/ (dated at least as early as Dec. 1, 2021) 4 pages.

*Primary Examiner* — Tsion Tumebo
(74) *Attorney, Agent, or Firm* — Lucian Wayne Beavers; Nathan I. North; Patterson Intellectual Property Law, PC

(57) ABSTRACT

The present disclosure relates to a method of manufacturing a tamper proof light emitting module comprising the steps of (a) pre-assembling the light emitting module into a testing configuration including a housing and one or more light emitting elements mounted within the housing, the housing including first and second housing components connected together using at least one removable fastener connecting the first and second housing components; (b) testing the light emitting module to confirm the light emitting elements are operable; (c) after step (b), removing the removable fastener; (d) replacing the removable fastener removed in step (c) with at least one breakaway fastener; and (e) tightening the breakaway fastener(s) until the head of the breakaway fastener(s) breaks off so that the breakaway fastener(s) is no longer removable, thereby creating a final, tamper proof configuration of the light emitting module.

18 Claims, 9 Drawing Sheets

(56) References Cited

U.S. PATENT DOCUMENTS

| | | | |
|---|---|---|---|
| 2007/0086198 A1* | 4/2007 | Wilson | F21V 3/00 362/382 |
| 2010/0246193 A1* | 9/2010 | Clifton | F21S 8/026 362/365 |
| 2012/0236578 A1* | 9/2012 | Davis | F21V 15/005 362/375 |
| 2012/0314429 A1* | 12/2012 | Plunk | F21V 15/005 362/374 |
| 2013/0093325 A1* | 4/2013 | Scarpelli | H05B 45/36 315/85 |
| 2014/0168961 A1* | 6/2014 | Dubord | F21V 7/0016 362/225 |
| 2015/0102728 A1* | 4/2015 | Kim | H05B 45/14 315/151 |
| 2018/0216802 A1* | 8/2018 | Johnson, III | F21V 19/04 |
| 2018/0306395 A1* | 10/2018 | Conrad | F21K 9/232 |
| 2018/0320847 A1* | 11/2018 | Moghal | F21S 8/086 |

\* cited by examiner

MANUFACTURING OF LIGHT EMITTING MODULES

FIELD OF THE DISCLOSURE

The present disclosure relates to light emitting modules and methods of manufacturing the same.

BACKGROUND

Manufacturing a light emitting module traditionally either meant that the manufacturer could make the light emitting module such that it was modular or such that it was tamper proof, but not both. The modular light emitting module could be taken apart and pieces replaced by users after the manufacturing process. An example of the modular light emitting module is light emitting module disclosed in U.S. Pat. No. 7,348,604.

But such modular light emitting modules can be tampered with after the manufacturing process, which can cause parts to break. Further, modular light emitting modules generally need to configure the internal components, such as a battery and the light emitting unit, such that if the light emitting module is opened, the internal components can stay mounted in the light emitting module's housing. Further, such modular light emitting modules may also need to be configured such that a user can easily access and replace the internal components. To allow such capabilities, the housing must include structures for supporting the internal components and holding those components in place. These structures mean that there is less space for the internal components within the housing. This may, for example, mean a smaller battery must be used. A modular light emitting module may also necessitate a design that the user can more easily reassemble, which often requires additional structural elements in or around the housing. These design elements may also be important, for example, to ensure that the light emitting module remains waterproof or water resistant even if the user takes apart the modular light emitting module.

Tamper proof light emitting modules, on the other hand, provide a device that consumers cannot take apart, meaning that less structure is required in the housing and more space may be dedicated to internal components such as the battery. Such tamper proof light emitting modules may also enable greater water proofing by permanently sealing the light emitting module. For example, the connection may be made using glue or a tighter fixed screw.

Traditional tamper proof light emitting modules, however, cannot be tested before they are packaged together. As a result, if the light emitting module has any faulty parts, such as the light emitting elements not operating, then the malfunctioning light emitting elements cannot be fixed or replaced, and the entire light emitting module must be thrown away.

Accordingly, there is a need for a tamper proof light emitting module that can be tested to ensure all of the components work before the final assembly. Such a light emitting module reduces waste during the manufacturing process while also allowing the manufacturer to maximize the internal space of the housing for the internal components and configuring the light emitting module for benefits such as improved waterproofing or water resistance.

SUMMARY OF THE DISCLOSURE

Briefly, the present disclosure relates, in one aspect of the disclosure, to a method of manufacturing a tamper proof light emitting module comprising the steps of (a) pre-assembling the light emitting module into a testing configuration including a housing and one or more light emitting elements mounted within the housing, the housing including first and second housing components connected together using at least one removable fastener connecting the first and second housing components; (b) testing the light emitting module to confirm the light emitting elements are operable; (c) after step (b), removing the removable fastener; (d) replacing the removable fastener removed in step (c) with at least one breakaway fastener; and (e) tightening the breakaway fastener(s) until the head of the breakaway fastener(s) breaks off so that the breakaway fastener(s) is no longer removable, thereby creating a final, tamper proof configuration of the light emitting module.

In another aspect of the disclosure, a method of manufacturing a tamper proof light emitting module comprises (a) pre-assembling the light emitting module into a testing configuration including a housing and one or more light emitting elements mounted within the housing, the housing including first and second housing components connected together; (b) testing the light emitting module to confirm the light emitting elements are operable; (c) after step (b), connecting the first and second housing components with at least one breakaway fastener; and (d) tightening the breakaway fastener(s) until the head of the breakaway fastener(s) breaks off so that the breakaway fastener(s) is no longer removable, thereby creating a final, tamper proof configuration of the light emitting module.

In either of the above aspects, the testing in step (b) may further comprise actuating a power actuator configured to turn on the light emitting module; and proceeding to step (c) if the light emitting module emits light. In another embodiment, the testing in step (b) may further comprise initiating a testing mode configured to operate the one or more light emitting elements individually. In some embodiments, the testing mode is further configured to automatically turn each light emitting element on and off and then operate the next light emitting element.

In other embodiments, if the testing in step (b) indicates any of the light emitting elements are not operable, the method may further comprise disassembling the light emitting module; replacing the light emitting element that are not operable with a corresponding number of replacement light emitting elements; and preassembling the light emitting module into a testing configuration including the housing, any operable light emitting elements and the replacement emitting element(s) mounted within the housing, the first and second housing components connected the first and second housing components. In some embodiments, the first and second housing components may be connected together using at least one removable fastener. In some embodiments, the method may further comprise retesting the light emitting module to confirm an operability of the one or more replacement light emitting elements.

In another embodiment, the one or more breakaway screws include two breakaway screws.

In another embodiment, the method may further comprise attaching a mounting bracket to the housing. In some embodiments, the mounting bracket is pivotally attached to the housing.

Numerous objects, features and advantages of the present invention will be readily apparent to those skilled in the art upon a review of following description in conjunction with the accompanying drawings.

DETAILED DESCRIPTION

Figure 1:
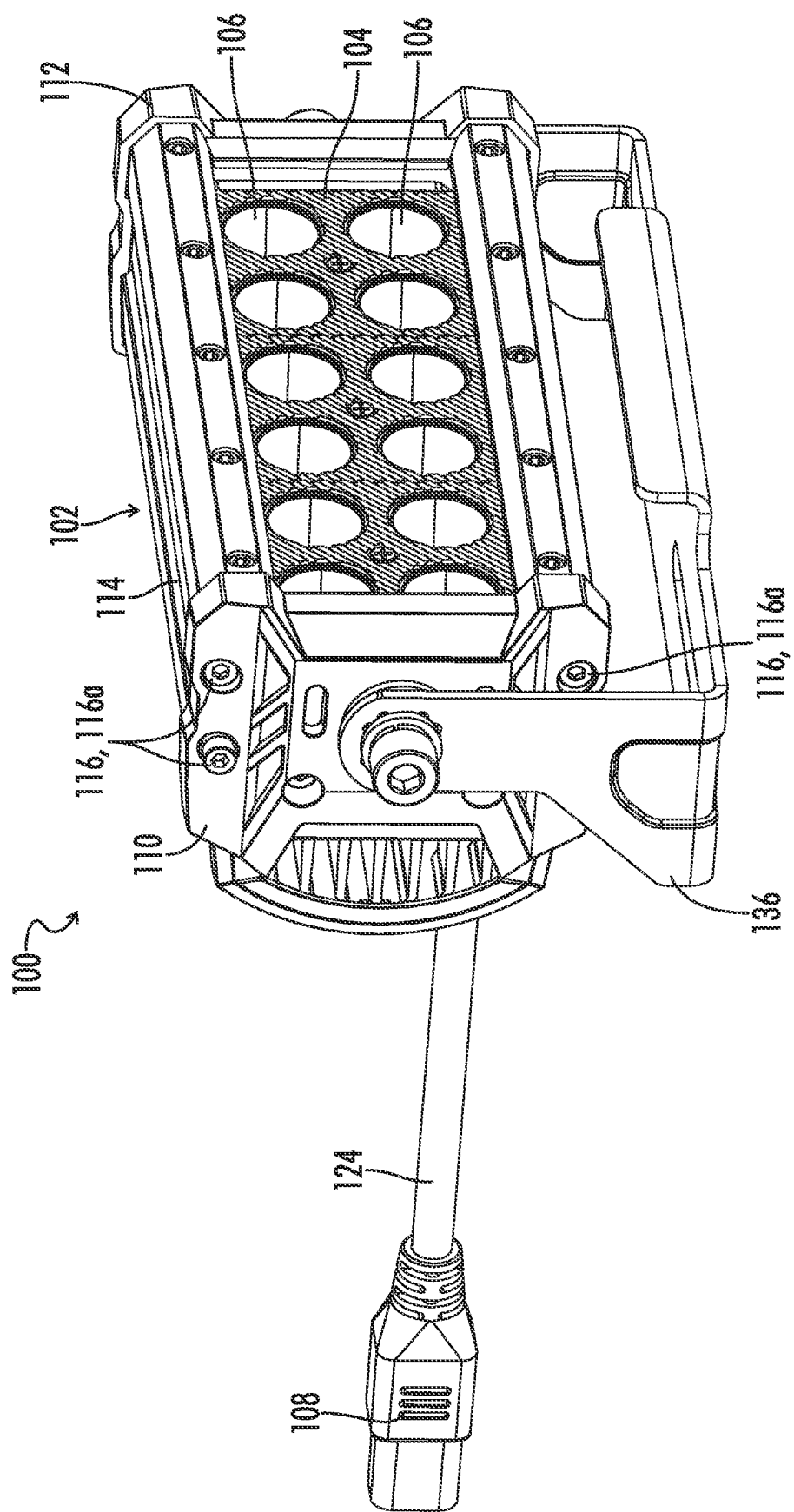
FIG. 1 illustrates an isometric view of an embodiment of a light emitting module.
Figure 2:
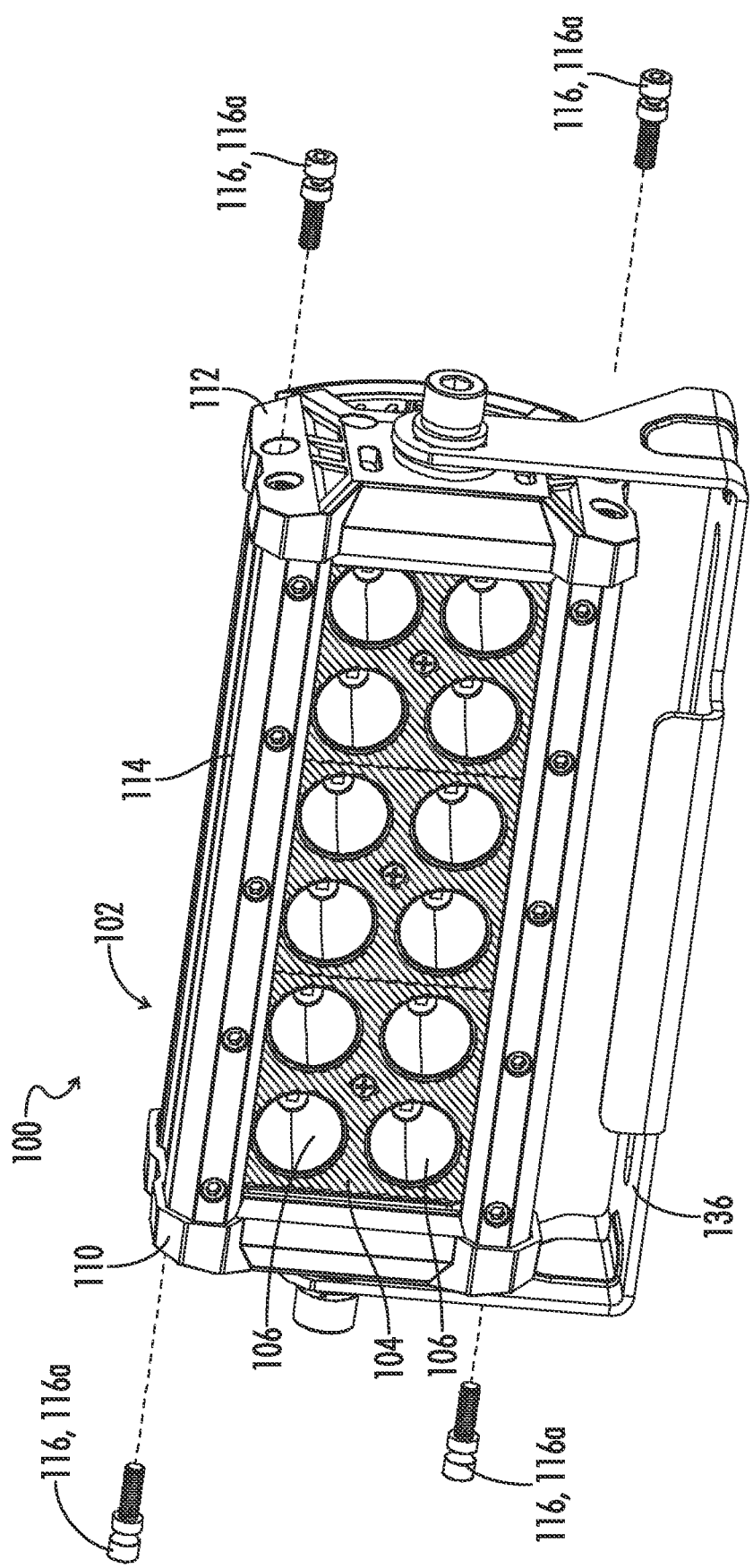
FIG. 2 illustrates an isometric view of the light emitting module of FIG. 1 with the permanent fasteners unattached to the housing.
Figure 3:
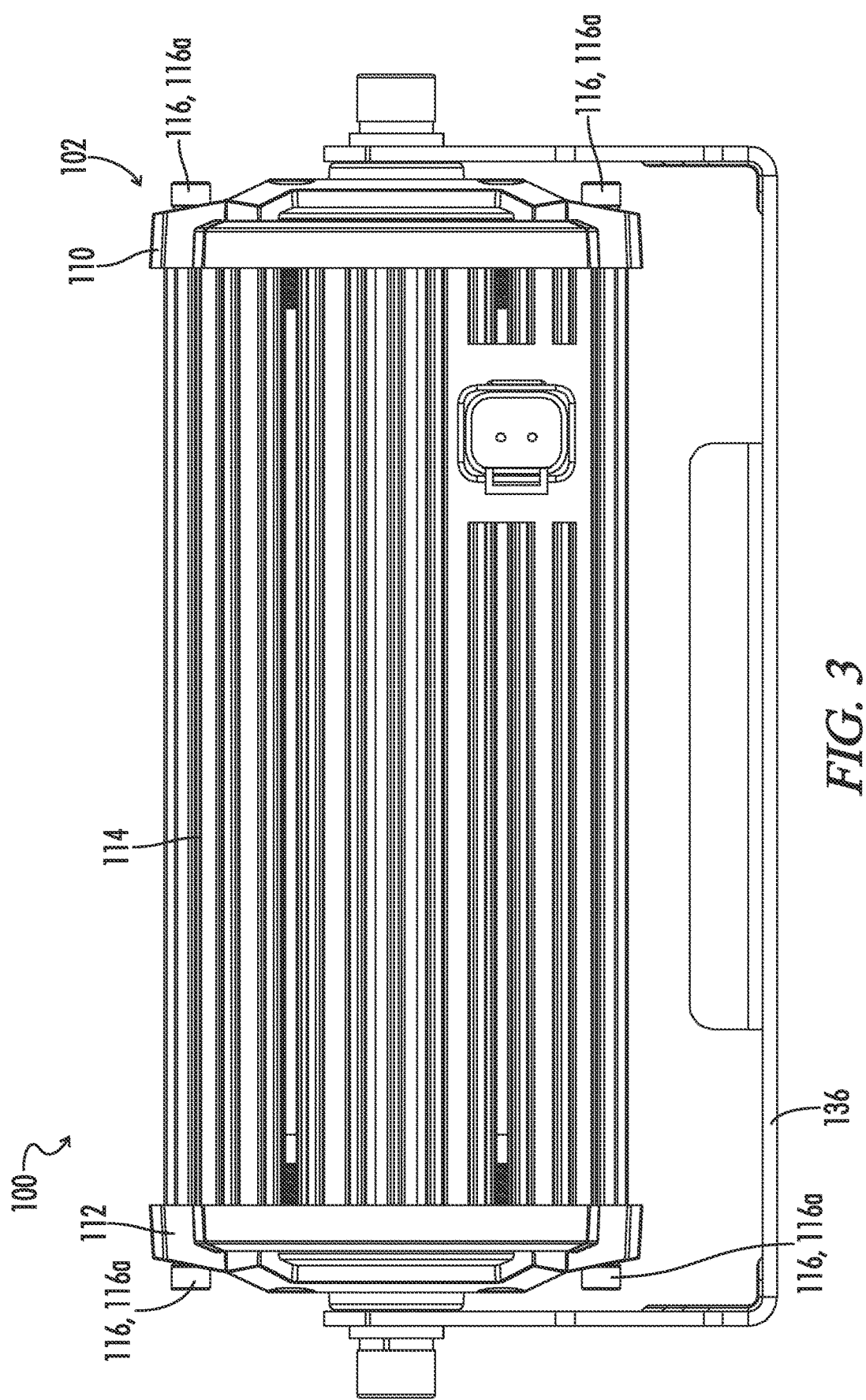
FIG. 3 illustrates a rear view of the light emitting module of FIG. 1.

Reference will now be made in detail to embodiments of the present disclosure, one or more drawings of which are set forth herein. Each drawing is provided by way of explanation of the present disclosure and is not a limitation. In fact, it will be apparent to those skilled in the art that various modifications and variations can be made to the teachings of the present disclosure without departing from the scope of the disclosure. For instance, features illustrated or described as part of one embodiment can be used with another embodiment to yield a still further embodiment.

Thus, it is intended that the present disclosure covers such modifications and variations as come within the scope of the appended claims and their equivalents. Other objects, features, and aspects of the present disclosure are disclosed in, or are obvious from, the following detailed description. It is to be understood by one of ordinary skill in the art that the present discussion is a description of exemplary embodiments only and is not intended as limiting the broader aspects of the present disclosure.

FIGS. 1-4 show an embodiment of a tamper proof light emitting module 100. The light emitting module 100 includes a housing 102, a light emitting assembly 104 that includes one or more light emitting elements 106, and a power actuator 108. The power actuator 108 may be a button, switch, or any other actuator known to a skilled artisan.

Figure 4:
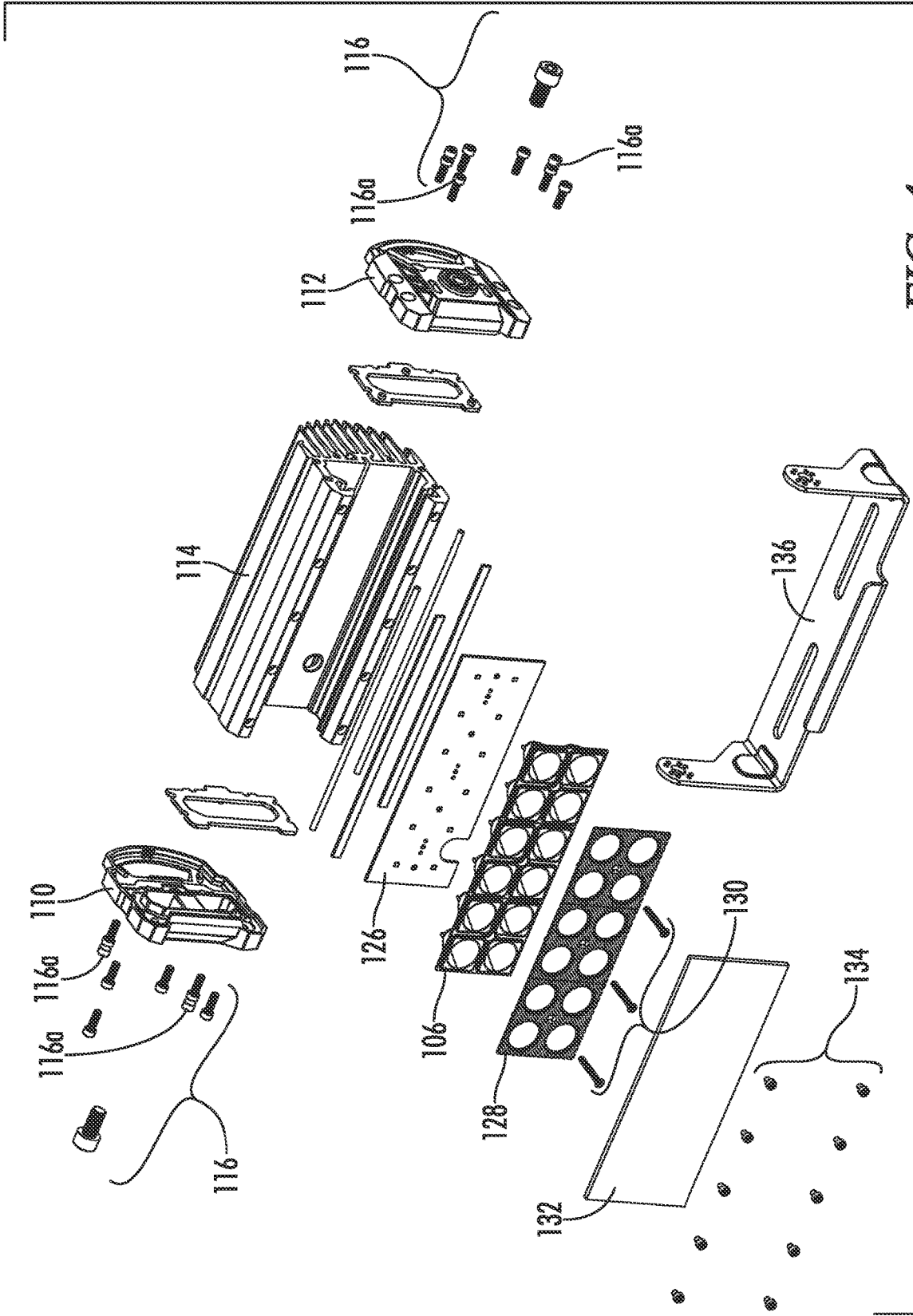
FIG. 4 illustrates an exploded view of the light emitting module of FIG. 1.

As shown in FIG. 4, the housing 102 includes the housing components 110, 112, 114. The housing components 110, 112 connect to the housing component 114 using the fasteners 116. The fasteners 116 may be removable screws, breakaway screws, rivets, or any other known fastener or any combination thereof. To make the light emitting module 100 tamper proof, at least one of the fasteners 116 permanently connect the housing components 110, 112, 114. For example, the embodiment illustrated in FIG. 2 includes four breakaway screws 116a in the group of fasteners 116.

Figure 5A:
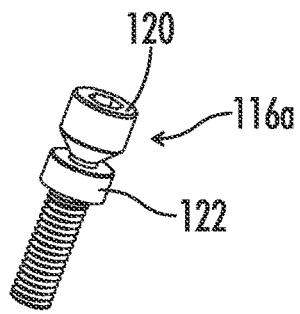
FIG. 5A illustrates a breakaway screw before the top portion is removed.
Figure 5B:
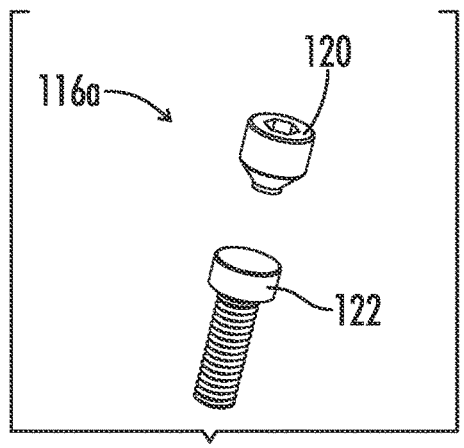
FIG. 5B illustrates the breakaway screw of FIG. 5A with the top portion removed from the main body.
Figure 5C:
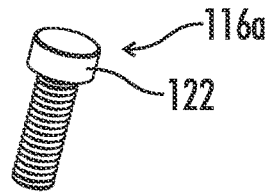
FIG. 5C illustrates the breakaway screw of FIG. 5A in its final configuration.

FIG. 5A illustrates an embodiment of a breakaway screw 116a as a screw that includes a top portion 120 configured to engage with a tool, such as a screwdriver, to tighten the breakaway screw 116a. As shown in FIG. 5B, once the breakaway screw 116a is tightened, the user can continue to twist the breakaway screw 116a with the tool until the top portion 120 of the breakaway screw 116a comes off the main body 122 of the breakaway screw 116a. As shown in FIG. 5C, with the top portion 120 of the breakaway screw 116a removed, the breakaway screw 116a cannot be engaged with a tool and is thereby permanently fixed in place and is no longer removable. Such breakaway screws are known, for example Tork-Bolts® manufactured by Loss Prevention Fasteners & Tools.

As shown in FIG. 1, the housing 102 may be configured to hold a light emitting assembly 104 and to connect to a power source (not shown). The housing 102 may connect to the power source via a cable 124. In other embodiments, the power source may be, for example, a battery. In such embodiments, the power source is mounted into the housing component 114. An electronics board 126 connects to the light emitting elements 106. The embodiment illustrated in FIGS. 1-4 includes twelve light emitting elements 106. A facia panel 128 then connects to the light emitting elements 106 and the electronics board 126 using, for example, the fasteners 130, thereby forming a light emitting assembly 104. A transparent cover 132 then fits over the light emitting assembly 104 and connects to the housing 102 using a plurality of fasteners 134.

The housing 102 may further connect to a mounting bracket 136. The mounting bracket 136 may be used to connect to a vehicle or other applications. The mounting bracket 136 may connect to the housing 102 such that the housing 102 can pivot, allowing a user to move the light emitting module 100 to shine the light on a specific spot.

FIGS. 6-9 show another embodiment of a tamper proof light emitting module 200. The light emitting module 200 includes a housing 202, a light emitting assembly 204 that includes one or more light emitting elements 206, and a power actuator 208. The power actuator 208 may be a button, switch, or simply a plug that is manually inserted in a power outlet, or any other actuator known to a skilled artisan.

Figure 8:
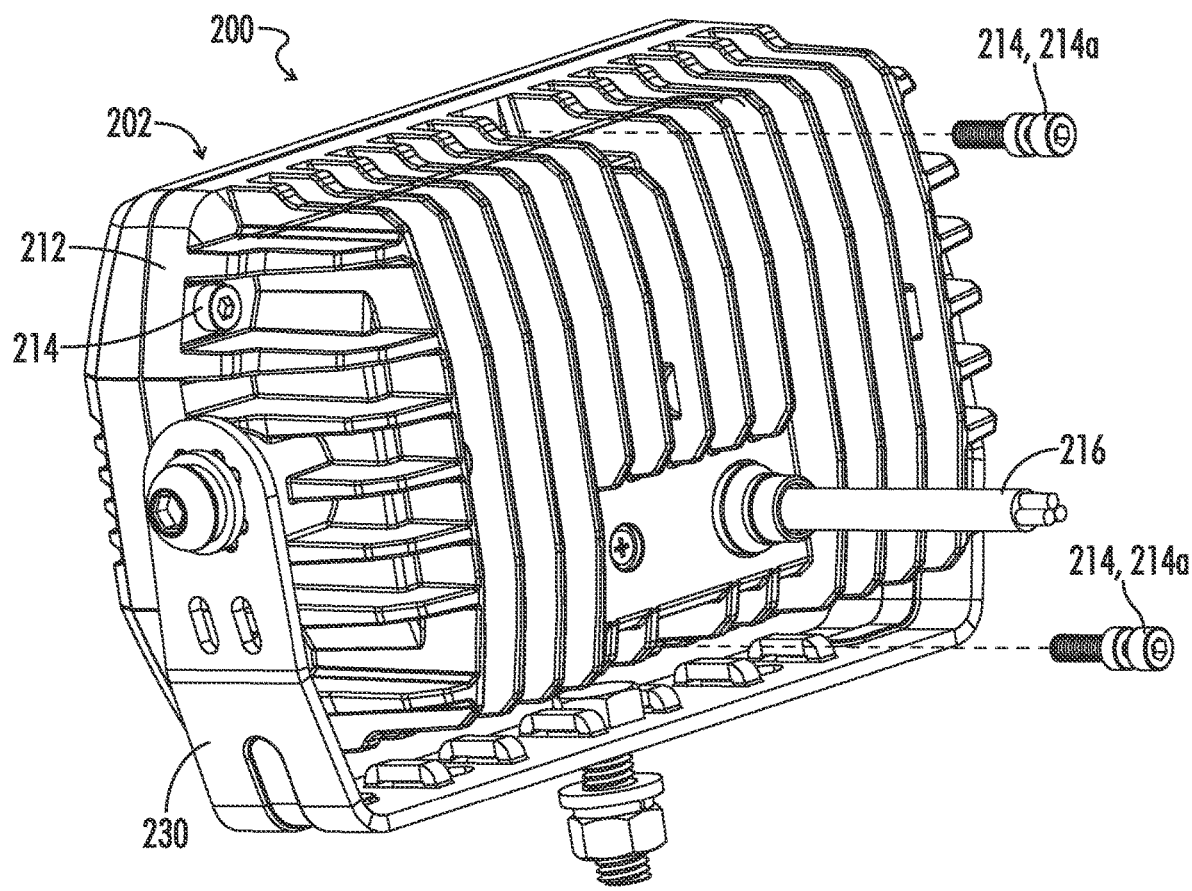
FIG. 8 illustrates a rear view of the light emitting module of FIG. 6.
Figure 9:
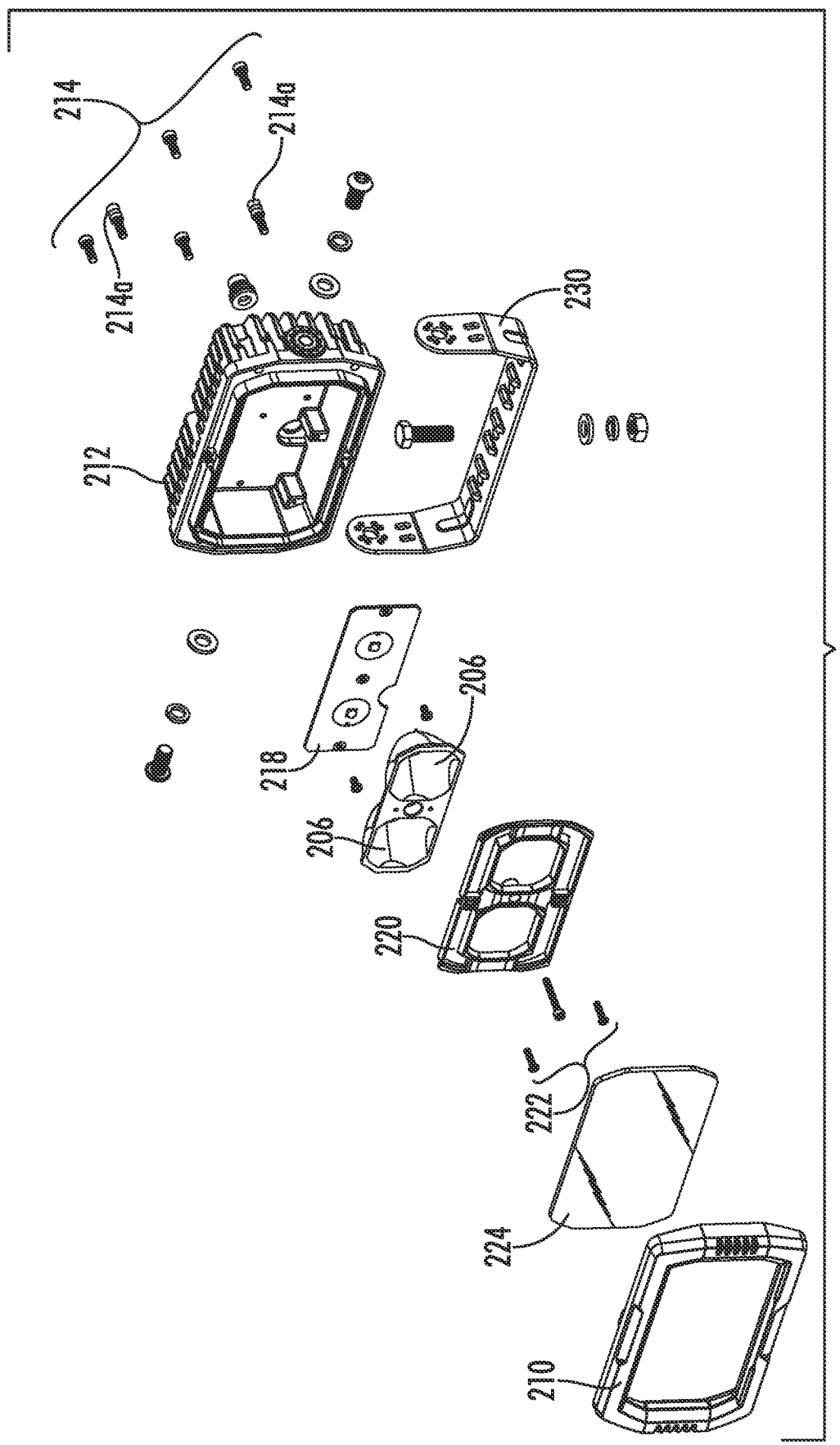
FIG. 9 illustrates an exploded view of the light emitting module of FIG. 6.

As shown in FIG. 9, the housing 202 includes the housing components 210, 212. The housing components 210, 212 connect to each other using the fasteners 214. The fasteners 214 may be removable screws, breakaway screws, or any other known fastener or any combination thereof. To make the light emitting module 200 tamper proof, at least one of the fasteners 214 permanently connects the housing components 210, 212. For example, the embodiment illustrated in FIG. 8 includes two breakaway screws 214a in the group of fasteners 214, which are the same or similar to breakaway screws 116a shown in FIGS. 5A-C.

Figure 6:
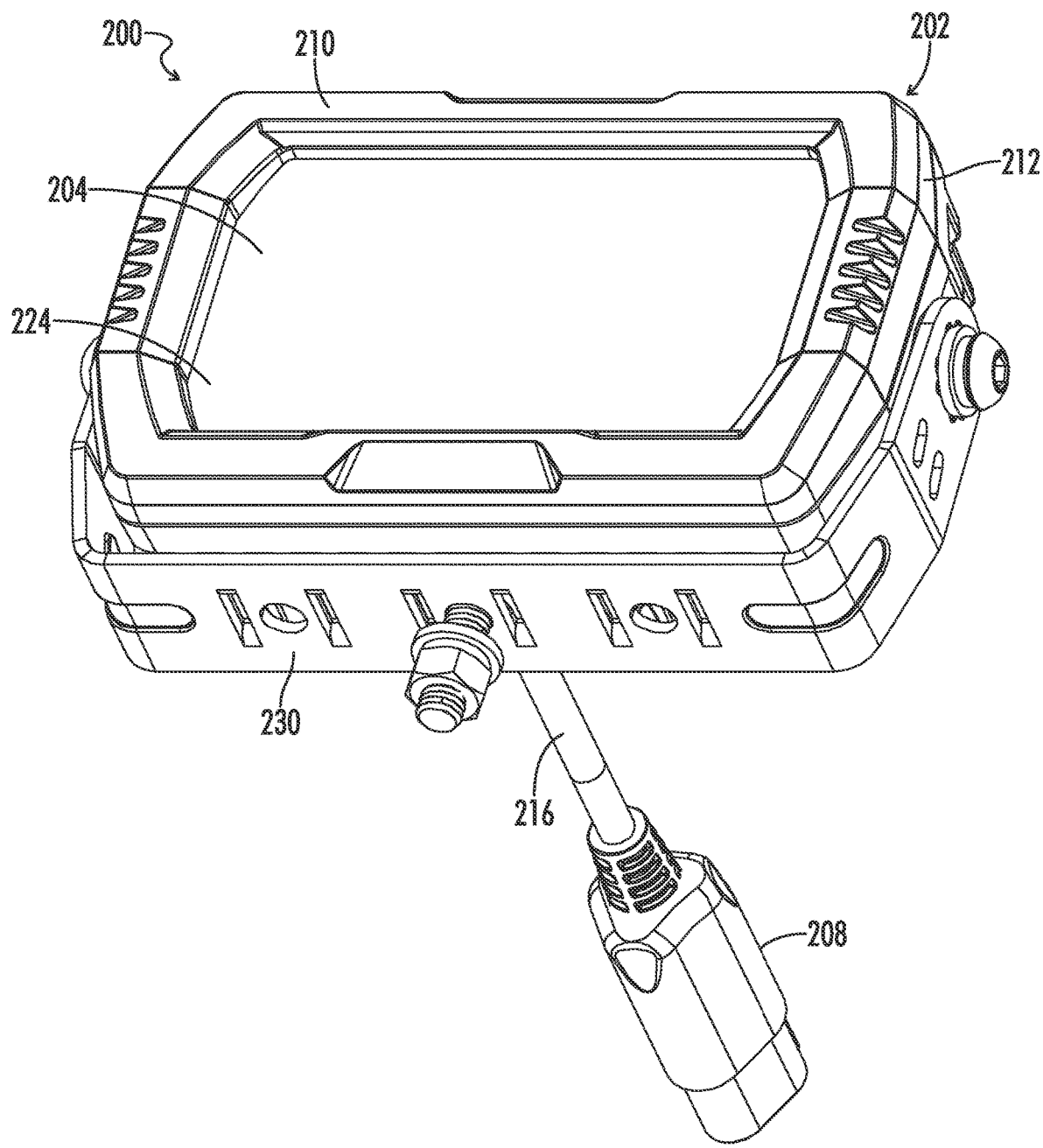
FIG. 6 illustrates an isometric view of another embodiment of a light emitting module.
Figure 7:
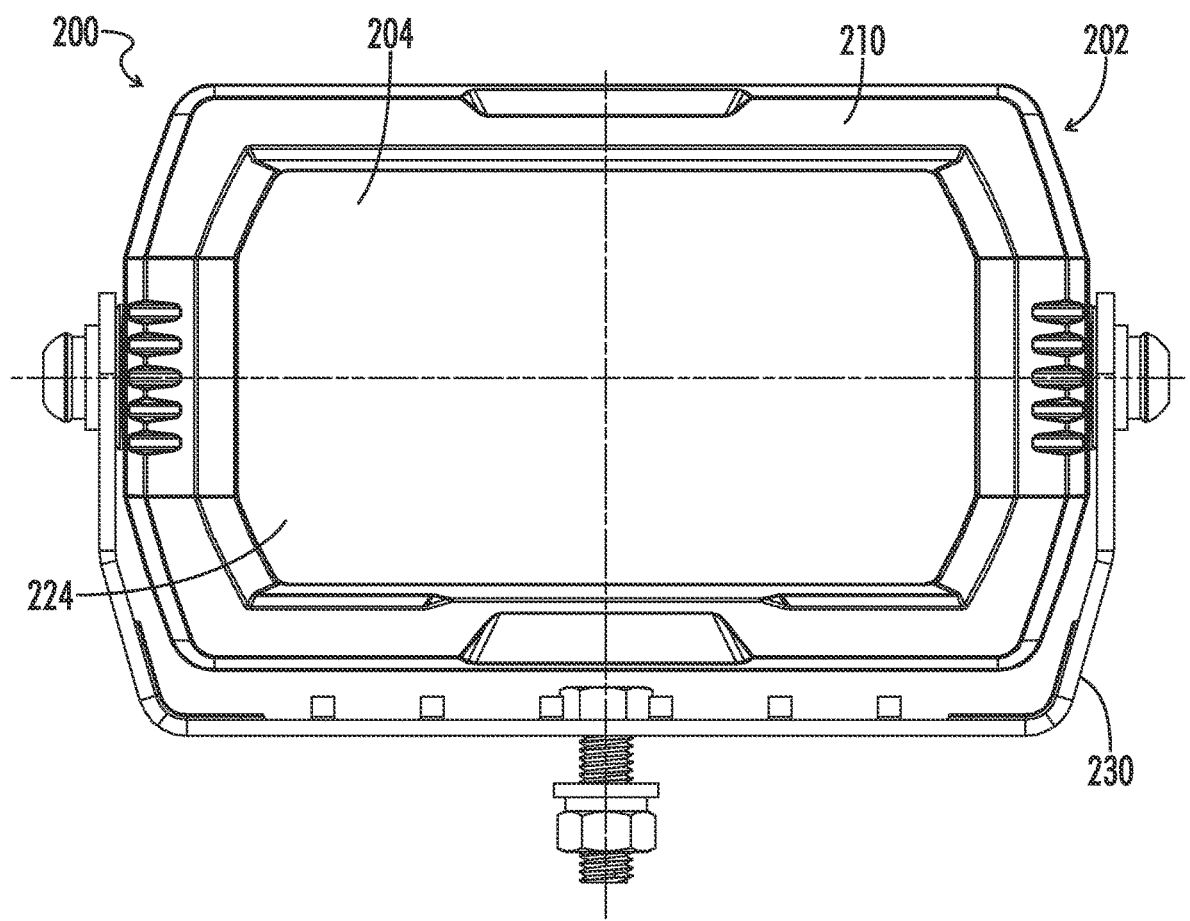
FIG. 7 illustrates a front view of the light emitting module of FIG. 6.

As shown in FIGS. 6 and 8, the housing 202 may be configured to hold the light emitting assembly 204 and to connect to a power source (not shown). The housing 202 may connect to the power source via a cable 216. In other embodiments, the power source may be, for example, a battery. In such embodiments, the power source is mounted into the housing component 212. An electronics board 218 connects to the light emitting elements 206. The light emitting assembly 204 may then be mounted in the housing component 212 using facia panel 220 and fasteners 222. The embodiment illustrated in FIG. 9 includes two light emitting elements 206. A transparent cover 224 then fits over the light emitting assembly 204 and is also mounted into the housing component 212. The housing component 210 may then fit over the mounted light emitting assembly 204 and the transparent cover 224 to connect to the housing component 212. When the housing components 210, 212 are connected by the fasteners 214, the housing components 210, 212 secure the light emitting assembly 204 and the transparent cover 224 into the housing 202.

The housing 202 may further connect to the mounting bracket 230. The mounting bracket 230 may be used to connect to a vehicle or other application. The mounting bracket 230 may connect to the housing 202 such that the housing 202 can pivot, allowing a user to move the light emitting module 200 to shine the light on a specific spot.

Each of the embodiments described above can be manufactured using a method of temporarily connecting the housing components 102, 202, allowing the manufacturer to test the light emitting module 100, 200 to determine if it is operable, and then permanently connecting the housing components 110, 112, 114 and 210, 212 into a final configuration that makes the light emitting module 100, 200 tamper proof. The method described below uses the embodiment illustrated in FIGS. 6-9 to illustrate the steps of the method.

The first step of the method is to preassemble the light emitting module 200 into a testing configuration. The step includes mounting the light emitting assembly 204, including the light emitting elements 206, and connecting the power source to the housing 202. For example, in the embodiment of FIG. 6, the light emitting assembly 204 is mounted into the housing component 212 and the cable 216 is connected to the housing component 212. The housing component 210 is then connected with the housing component 212 using at least one removable or otherwise temporary fastener 214. For example, the removable or otherwise temporary fastener 214 may be a screw, a bolt, a pin, a clamp, or any other fastener that would occur to a skilled artisan. Alternatively, the housing components 210, 212 may be connected using a breakaway screw, e.g., 214a, that is not tightened to the point that the top portion comes off the main body.

The second step of the method includes testing the light emitting module 200 to confirm that the light emitting elements 206 operate correctly. In some embodiments of the method, testing the light emitting module 200 includes actuating the power actuator 208, such as a power button, to turn on the light emitting module 200, including the light emitting elements 206. The light emitting elements 206 are considered to operate correctly in this embodiment if the light emitting elements 206 emit light when the power actuator 208 is actuated.

In some embodiments of the method, the testing step may involve initiating a testing mode programmed into the electronics board 218. In one embodiment, when the testing mode is initiated, the electronics board 218 operates each light emitting element 206 individually based on a tester's input, such as actuating the power actuator 208. Another embodiment of the testing mode may include the electronics board 218 automatically turning each light emitting element 206 on and off independently until each light emitting element 206 has been tested. In this way, the electronics board 218 cycles through each of the light emitting elements 206 automatically without a tester input. By testing each light emitting element 206 individually, this testing mode allows the tester to determine exactly which light emitting elements 206 operate correctly and which light emitting elements 206 should be replaced. In other embodiments, the testing mode may be configured to operate any combination of more than one light emitting element 206 for testing.

In some embodiments, if the testing of the second step shows that any of the light emitting elements 206 are not operating correctly, then the light emitting module 200 is disassembled, such as by removing each of the removable fasteners 214. The light emitting elements 206 that are not operating correctly are then replaced with a corresponding number of replacement light emitting elements 206. The light emitting module 200 is then preassembled into the testing configuration again. The light emitting module 200 may then be retested to confirm that all of the replacement light emitting elements 206 operate correctly.

If the testing of the second step shows that all the light emitting elements 206 are working, the third step of the method is to remove at least one removable or otherwise temporary fastener 214. The fourth step of the method is then to replace the removed removable fastener with a permanent fastener, such as a breakaway screw 214a. These steps of replacing removable or otherwise temporary fasteners 214 may be omitted in the embodiment where the breakaway screws 214a were used to connect the housing components 210, 212 in step 1.

The fifth step is to affix the permanent fastener 214a such that the light emitting module 206 is in a final, tamper proof configuration such that a user cannot open the light emitting module 200 without breaking the housing 202. In embodiments using a breakaway screw, this step consists of tightening the breakaway screw, e.g., breakaway screw 214a, until the top portion 120 of the breakaway screw 214a comes off the main body 122 of the breakaway screw 214a. With the top portion 120 of the breakaway screw 214a removed, the breakaway screw 214a is permanently fixed in place and is no longer removable. In some embodiments, such as the embodiment illustrated in FIG. 8, two or more breakaway screws may be used.

The method may further include attaching the mounting bracket 230 to the housing 200. The mounting bracket 230 may further be connected pivotally to the housing 202 such that the light emitting module 200 can be moved to shine the light on a specified spot.

Thus, it is seen that the apparatus and methods of the present disclosure readily achieve the ends and advantages mentioned as well as those inherent therein. While certain preferred embodiments of the disclosure have been illustrated and described for present purposes, numerous changes in the arrangement and construction of parts and steps may be made by those skilled in the art, which changes are encompassed within the scope and spirit of the present disclosure as defined by the appended claims Each disclosed feature or embodiment may be combined with any of the other disclosed features or embodiments.

What is claimed is:

1. A method of manufacturing a tamper proof light emitting module, the method comprising:
   (a) pre-assembling the light emitting module into a testing configuration including a housing and one or more light emitting elements mounted within the housing, the housing including first and second housing components connected together using at least one removable fastener connecting the first and second housing components;
   (b) testing the light emitting module to confirm an operability of the one or more light emitting elements;
   (c) after the testing in step (b), removing the at least one removable fastener;
   (d) replacing the at least one removable fastener removed in step (c) with at least one breakaway fastener; and
   (e) tightening the at least one breakaway fastener until a head of the at least one breakaway fastener breaks off so that the at least one breakaway fastener is no longer removable, thereby creating a final, tamper proof configuration of the light emitting module.

2. The method of claim 1, wherein the testing in step (b) further comprises:

actuating a power actuator configured to turn on the light emitting module; and proceeding to step (c) if the light emitting module emits light.

3. The method of claim 1, wherein the testing in step (b) further comprises:

initiating a testing mode configured to operate the one or more light emitting elements individually.

4. The method of claim 3, wherein the testing mode is configured to automatically turn each light emitting element on and off and then operate the next light emitting element.

5. The method of claim 1, wherein if the testing in step (b) indicates any of the one or more light emitting elements are not operable, the method of claim 1 further comprises:

disassembling the light emitting module;

replacing the one or more light emitting elements that are not operable with a corresponding number of replacement light emitting elements; and preassembling the light emitting module into a testing configuration including the housing, the one or more operable light emitting elements and the one or more replacement emitting elements mounted within the housing, the first and second housing components connected together using at least one removable fastener connecting the first and second housing components.

6. The method of claim 5, further comprising the step of:

retesting the light emitting module to confirm an operability of the one or more replacement light emitting elements.

7. The method of claim 1, wherein the one or more breakaway screws include two breakaway screws.

8. The method of claim 1, further comprising the step of:

attaching a mounting bracket to the housing.

9. The method of claim 8, wherein the mounting bracket is pivotally attached to the housing.

10. A method of manufacturing a tamper proof light emitting module, the method comprising:

(a) pre-assembling the light emitting module into a testing configuration including a housing and one or more light emitting elements mounted within the housing, the housing including first and second housing components connected together;

(b) testing the light emitting module to confirm an operability of the one or more light emitting elements;

(c) after the testing in step (b), connecting the first and second housing components with at least one breakaway fastener; and (d) tightening the at least one breakaway fastener until a head of the at least one breakaway fastener breaks off so that the at least one breakaway fastener is no longer removable, thereby creating a final, tamper proof configuration of the light emitting module.

11. The method of claim 10, wherein the testing in step (b) further comprises:

actuating a power actuator configured to turn on the light emitting module; and proceeding to step (c) if the light emitting module emits light.

12. The method of claim 10, wherein the testing in step (b) further comprises:

initiating a testing mode configured to operate the one or more light emitting elements individually.

13. The method of claim 12, wherein the testing mode is configured to automatically turn each light emitting element on and off and then operate the next light emitting element.

14. The method of claim 10, wherein if the testing in step (b) indicates any of the one or more light emitting elements are not operable, the method of claim 1 further comprises:

disassembling the light emitting module;

replacing the one or more light emitting elements that are not operable with a corresponding number of replacement light emitting elements; and preassembling the light emitting module into a testing configuration including the housing, the one or more operable light emitting elements and the one or more replacement emitting elements mounted within the housing, the first and second housing components connected together using at least one removable fastener connecting the first and second housing components.

15. The method of claim 14, further comprising the step of:

retesting the light emitting module to confirm an operability of the one or more replacement light emitting elements.

16. The method of claim 10, wherein the one or more breakaway screws include two breakaway screws.

17. The method of claim 10, further comprising the step of:

attaching a mounting bracket to the housing.

18. The method of claim 17, wherein the mounting bracket is pivotally attached to the housing.

\* \* \* \* \*